United States Patent
Suzuki

(10) Patent No.: US 10,553,528 B2
(45) Date of Patent: Feb. 4, 2020

(54) METHOD FOR MANUFACTURING PRINTED-WIRING ASSEMBLY, AND PRINTED-WIRING ASSEMBLY MANUFACTURED ACCORDING TO THE SAME

(71) Applicant: DENSO WAVE INCORPORATED, Chita-gun, Aichi-pref. (JP)

(72) Inventor: Masashi Suzuki, Chita-gun (JP)

(73) Assignee: DENSO WAVE INCORPORATED, Aichi-Pref. (JP)

(*) Notice: Subject to any disclaimer, the term of this patent is extended or adjusted under 35 U.S.C. 154(b) by 0 days.

(21) Appl. No.: 16/287,025

(22) Filed: Feb. 27, 2019

(65) Prior Publication Data
US 2019/0267313 A1 Aug. 29, 2019

(30) Foreign Application Priority Data
Feb. 27, 2018 (JP) .................. 2018-032969

(51) Int. Cl.
*H05K 3/24* (2006.01)
*H05K 1/02* (2006.01)
*H01L 23/498* (2006.01)
*H01L 23/00* (2006.01)
*H01L 21/48* (2006.01)

(52) U.S. Cl.
CPC .... *H01L 23/49811* (2013.01); *H01L 21/4853* (2013.01); *H01L 21/4857* (2013.01); *H01L 23/49822* (2013.01); *H01L 24/10* (2013.01)

(58) Field of Classification Search
CPC ..... H05K 3/241; H05K 1/0284; H05K 1/0296
See application file for complete search history.

(56) References Cited

U.S. PATENT DOCUMENTS

2017/0170104 A1 6/2017 Shimizu

*Primary Examiner* — Jeremy C Norris
(74) *Attorney, Agent, or Firm* — Oliff PLC

(57) ABSTRACT

A method for manufacturing a printed-wiring assembly is provided. The method includes a first step of forming a first pattern of printed wiring extending to an end face of a substrate by copper or silver on the substrate. The method includes a second step of cutting the first pattern into a first portion on the end face side from a predetermined position and a second portion on the inner side of the predetermined position, and the cut surface in the second portion is inclined by a predetermined angle with respect to a surface perpendicular to the substrate. The method further includes a third step of forming a protective layer of the second portion so as to cover the cut surface.

14 Claims, 5 Drawing Sheets

END DIRECTION →

FIG.3 [COMPARATIVE EXAMPLE]
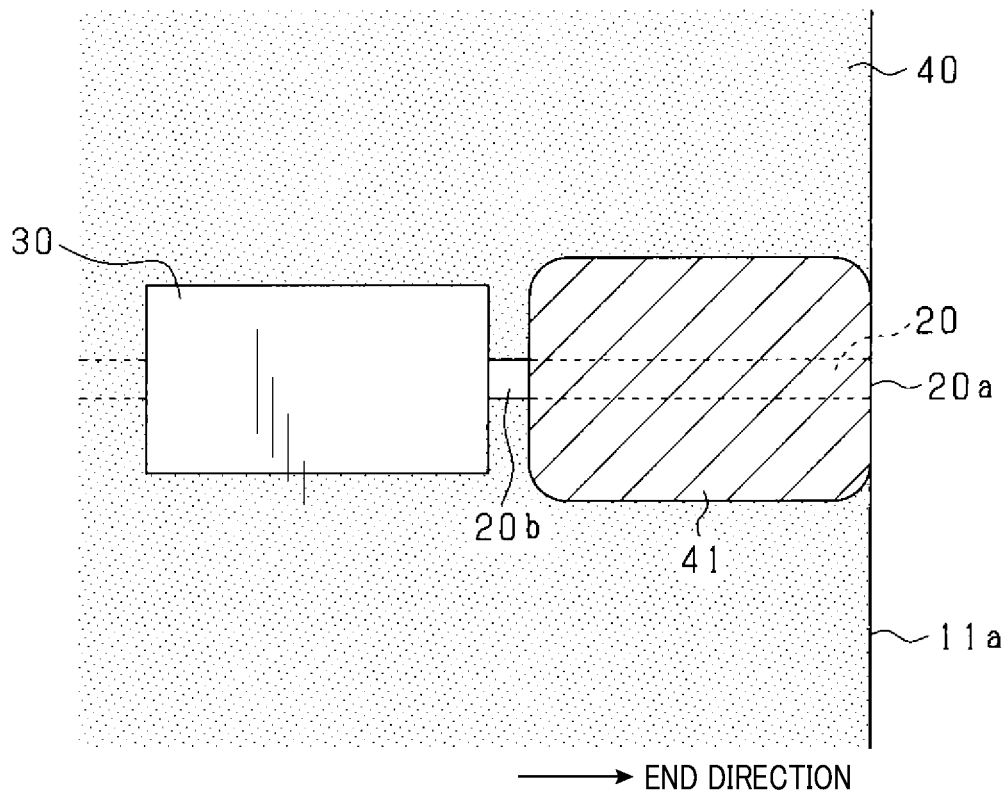
FIG.4
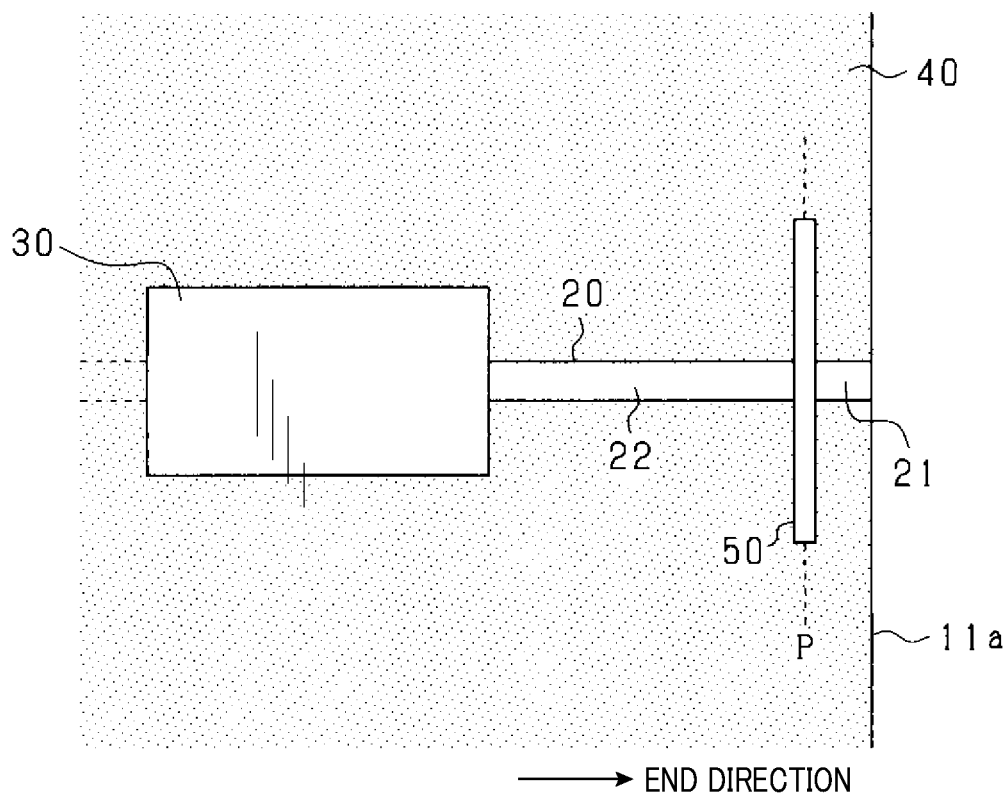

[COMPARATIVE EXAMPLE]

METHOD FOR MANUFACTURING PRINTED-WIRING ASSEMBLY, AND PRINTED-WIRING ASSEMBLY MANUFACTURED ACCORDING TO THE SAME

CROSS-REFERENCE TO RELATED APPLICATION

This application is based on and claims the benefit of priority from earlier Japanese Patent Application No. 2018-032969 filed on Feb. 27, 2018, the descriptions of which is incorporated herein by reference.

BACKGROUND

Technical Field

The present invention relates to a method of manufacturing a printed-wiring assembly and a printed-wiring assembly manufactured according to the same.

Related Art

Conventionally, there is a method for manufacturing a printed-wiring assembly in which a copper seed layer is formed by an electroless plating method, and an electrolytic copper plating layer is formed by an electrolytic plating method using the seed layer as a plating power supply layer. In the manufacturing method described in Patent literature 1, after the electrolytic copper plating layer is formed, the seed layer exposed from the electrolytic copper plating layer is removed by etching.

[PLT 1] JP 2017-108070 A

Incidentally, in the manufacturing method described in Patent literature 1, an etching step for removing the seed layer unnecessary for the printed-wiring assembly is required. Therefore, the manufacturing step cannot be simplified, which indicates that there is still a room for improvement.

SUMMARY

Hence, it is desired to provide a method for manufacturing printed-wiring assembly which can prevent/suppress corrosion of the printed wiring while simplifying the manufacturing step.

As an exemplary embodiment for solving the above-described problem is a method for manufacturing a printed-wiring assembly, which includes a first step of forming a first pattern of a printed wiring extending to an end face of the substrate by copper or silver on a substrate, a second step of cutting the first pattern into a first portion on the end face side of a predetermined position and a second portion on the inner side of the predetermined position, and the cut surface in the second portion is inclined by a predetermined angle with respect to a surface perpendicular to the substrate, and a third step of forming a protective layer of the second portion so as to cover the cut surface.

According to the above-described steps, in the first step, a first pattern of printed wiring, which extends to the end face of the substrate by copper or silver on the substrate, is formed. Since the first pattern of the printed wiring extends to the end face of the substrate, the first pattern becomes easier to use as a portion to which a voltage is applied in an electrolytic plating method or the like.

Here, since the first pattern of the printed wiring formed of copper or silver is easily corroded, the first pattern is required to be covered with a protective layer. However, if the first pattern has a portion extending to the end face of the substrate, the first pattern on the end face of the substrate will be difficult to cover with the protective layer.

In this respect, in the second step, the first pattern is cut into a first portion on the end face side from the predetermined position, and a second portion on the inner side from the predetermined position. Therefore, the first portion can be separated in the first pattern so that a portion extending to the end face of the substrate does not remain in the second portion.

Further, the cut surface in the second portion is inclined by a predetermined angle with respect to a surface perpendicular to the substrate. Therefore, as compared with the case where the cut surface in the second portion is perpendicular to the substrate, the cut surface in the second portion can be easily covered with the protective layer. Moreover, since the first pattern is only cut so that the cut surface in the second portion is inclined, it is easier than the etching step.

In the third step, a protective layer of the second portion is formed so as to cover the cut surface of the second portion. Therefore, corrosion of the printed wiring can be prevented/suppressed while simplifying the manufacturing step of the printed-wiring assembly. As another embodiment, the method may include a fourth step of applying a voltage to the first pattern to form a second pattern of an electrolytic plating layer on the first pattern by an electrolytic plating method between the first step and the second step, and in the second step, the predetermined position is a position between the end face and the second pattern.

According to the above-described step, in the fourth step between the first step and the second step, a voltage is applied to the first pattern to form the second pattern of the electrolytic plating layer on the first pattern by the electrolytic plating method. Therefore, the first pattern can be used as a power supply layer in the electrolytic plating method.

Then, in the second step, the first pattern is cut into a first portion on the end face side of the predetermined position between the end face of the substrate and the second pattern, and a second portion on the inner side of the predetermined position. Then, in a third step, a protective layer of the second portion is formed. Therefore, in the first pattern, the progress of corrosion can be almost prevented from the first portion which becomes unnecessary after the formation of the electrolytic plating layer.

As a further embodiment of the method, in the third step, the protective layer is formed so as to cover the cut surface and the space between the cut surface and the second pattern in the second portion. Therefore, exposure between the above-described cut surface and the second pattern in the second portion can be almost prevented, and corrosion of the second portion can be almost prevented.

When the cut surface in the second portion is polished after the first pattern is cut in the second step, the resist material becomes easier to flow over the cut surface when the protective layer is formed of a resist layer. In this case, the cut surface may become difficult to cover with the protective layer of the resist.

In this respect, in another embodiment, in the third step, the protective layer is formed of a resist material so as to cover the cut surface in the state in which the first pattern is cut in the second step. Therefore, the resist material can be almost prevented from flowing over the cut surface, and thus the cut surface can be easily covered by the protective layer of the resist. Further, the step of polishing the cut surface can be omitted, and thus the manufacturing step of the printed-wiring assembly can be simplified.

In a further embodiment, in the second step, the first pattern is cut by a device for cutting a substrate, and the cut surface is inclined by the predetermined angle with respect to a surface perpendicular to the substrate. Therefore, since the first pattern can be cut by using an existing apparatus, a new apparatus is not required.

Another exemplary embodiment relates to is a printed-wiring assembly, wherein a printed wiring pattern is formed of copper or silver on a substrate, a first portion extending from a predetermined position to an end face of the substrate, a second portion on the inner side of the predetermined position, the predetermined end face on the predetermined position side of the second portion being inclined by a predetermined angle with respect to a surface perpendicular to the substrate, and a protective layer of the second portion formed so as to cover the predetermined end face.

According to the above-described configuration, after the first pattern of the printed wiring extending to the end face of the substrate is formed on the substrate, and the first pattern is used as a portion to which a voltage is applied in an electrolytic plating method or the like, the first pattern can be cut into a first portion and a second portion. Since the first portion and the second portion are cut, the progress of corrosion from the first portion to the second portion can be prevented, and also, a portion extending to the end face of the substrate can be prevented from remaining in the second portion.

The predetermined end face of the second portion on the predetermined position side is inclined by a predetermined angle with respect to a surface perpendicular to the substrate. A protective layer of the second portion is formed so as to cover a predetermined end face of the second portion. Therefore, as compared with the case where the predetermined end face in the second portion is perpendicular to the substrate, the predetermined end face in the second portion becomes easier to cover with the protective layer. Therefore, corrosion of the printed wiring can be prevented/suppressed while simplifying the manufacturing step of the printed-wiring assembly.

As an example, the printed-wiring assembly is provided with a second pattern of a metal layer connected to the second portion, the predetermined position being a position between the end face of the substrate and the second pattern.

According to the above-described configuration, after the second pattern of the metal layer is formed as the electrolytic plating layer by the electrolytic plating method by applying a voltage to the first pattern, the first pattern can be cut at a predetermined position between the end face of the substrate and the second pattern. Therefore, in the first pattern, the progress of corrosion can be almost prevented from the first portion which becomes unnecessary after the formation of the metal layer.

In another embodiment, the protective layer covers the predetermined end face and a space between the predetermined end face and the second pattern in the second portion.

According to the above-described configuration, it is possible to almost prevent exposure of the second portion between the predetermined end face and the second pattern, and to almost prevent corrosion of the second portion.

BRIEF DESCRIPTION OF THE DRAWINGS

In the accompanying drawings.

FIG. 3 is an enlarged front view showing the printed-wiring assembly of the comparative example.
FIG. 4 is an enlarged front view showing the printed wiring pattern.

DESCRIPTION OF EMBODIMENTS

Hereinafter, an embodiment will be described with reference to the drawings. The present embodiment is embodied as a PLC (Programmable Logic Controller) board.

Figure 1:
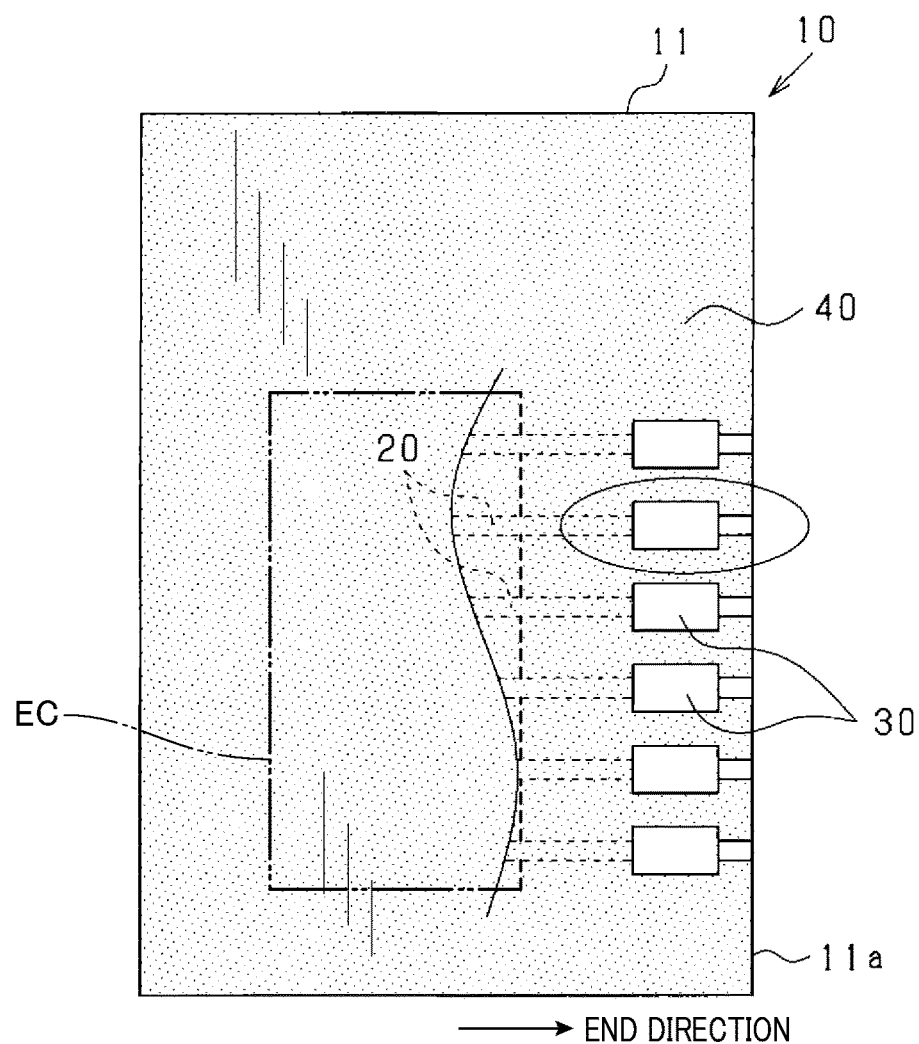
FIG. 1 is a front view showing a printed circuit board.

As shown in FIG. 1, there is provided a printed circuit board 10 which is a printed-wiring assembly. The printed circuit board 10 includes a substrate 11, a first pattern 20, a second pattern 30, a solder resist layer 40, and an electrical circuit EC necessary for the PLC. The first and second patterns are used as test terminals, for instance.

In the following drawings, for an easier tricultural understanding, the thickness of the layers of the first pattern 20 and the other layered components are exaggerated. Additionally, since the printed circuit board 10 is shaped into a rectangle in the embodiment, the board has wide and longitudinal directions (not shown in FIG. 1) and a thickness direction (refer to for example FIG. 5). As shown in FIG. 1, the first and second patterns 20 and 30 are formed to extend towards one lateral end on the printed circuit board 10, so that a direction along which the patterns 20 and 30 is referred to as an "end direction".

The substrate 11 is, for example, a glass epoxy substrate in which a glass fiber is impregnated with an epoxy resin and is thermally cured. The substrate 11 may be a substrate in which carbon fibers, aramid fibers, or the like are impregnated with an epoxy resin or the like.

The first pattern 20 is a pattern formed by forming a copper film on the substrate 11 by, for example, an electroless plating method, and also by etching the copper film. The first pattern 20 extends to an end face 11a of the substrate 11 in the end direction. The step of forming the first pattern 20 corresponds to the first step. The first pattern 20 may be a pattern formed of a silver film.

Figure 2:
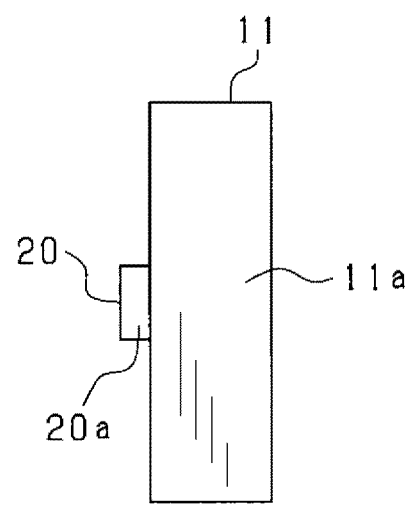
FIG. 2 is an enlarged side view showing the first pattern.

The second pattern 30 is a pattern formed as a gold film by an electrolytic plating method by applying a voltage to the first pattern 20 using, for example, the solder resist layer 40 as a mask. When the electrolytic plating method is performed, as shown in an enlarged side view of the first pattern 20 in FIG. 2, a voltage is applied from the end face 11a side of the substrate 11 to the end 20a of the first pattern 20. As a result, the first pattern 20 on the substrate 11 can be almost prevented from being damaged. The step of forming the second pattern 30 corresponds to the fourth step. The second pattern 30 may be a pattern formed of a film of copper or another metal.

FIG. 3 is an enlarged front view showing the printed-wiring assembly of the comparative example. Since the first pattern 20 formed of copper is easily corroded when exposed, the exposed portion of the first pattern 20 is covered with, for example, a coating layer 41. The coating layer 41 is made of, for example, resin or the like. At this time, the end 20a of the first pattern 20 is difficult to cover with the coating layer 41 on the end face 11a of the substrate 11. Therefore, corrosion of the first pattern 20 may progress from the end 20a. If the exposed portion 20b remains in the first pattern 20, corrosion of the first pattern 20 may progress from the exposed portion 20b.

Figure 5:
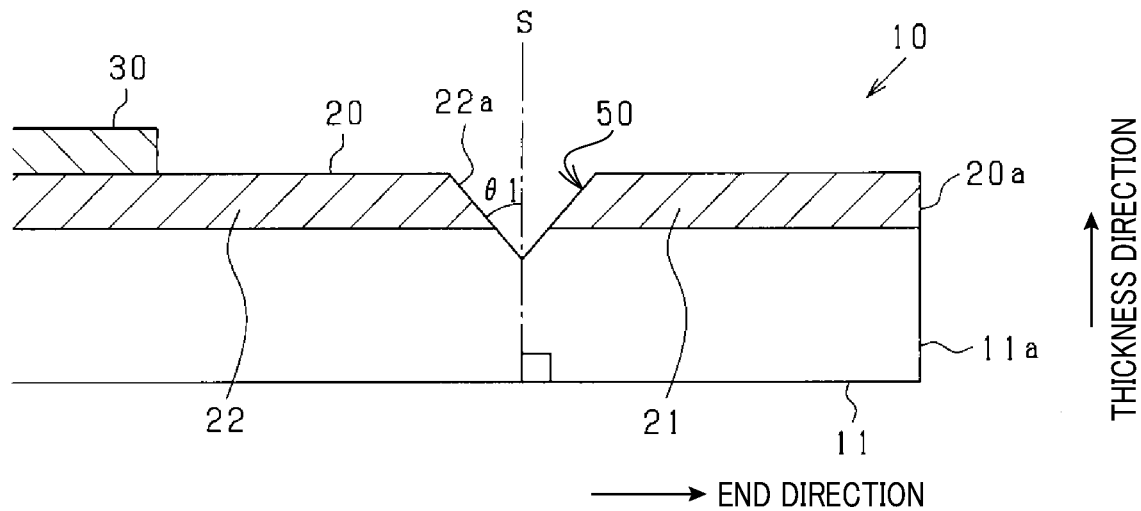
FIG. 5 is an enlarged cross-sectional view showing the printed wiring pattern.

Therefore, in the present embodiment, as shown in FIG. 4, the first pattern 20 is cut into a first portion 21 and a second portion 22 in the end direction (i.e., in the lateral direction). The first portion 21 is arranged on the side of the end face 11a with respect to the predetermined position P, whereas the second portion 22 is arranged on the inner side with respect to the predetermined position P. The predetermined position P is set at a position between the end face 11a and the second pattern 30. A V-shaped groove 50 is formed on the surface of the substrate 11 by cutting the first pattern 20. The longitudinal direction (i.e., the extending direction) of the V-shaped groove 50 is parallel to the end face 11a of the substrate 11. As shown in FIG. 5, the first pattern 20 is cut by forming the V-shaped groove 50 on the surface of the substrate 11 by a router (a device for cutting a substrate). In this case, by using an end mill for processing V-shaped grooves, the cut surface 22a (corresponding to a predetermined end face) of the second portion 22 is inclined by a predetermined angle θ1 with respect to an imaginary plane S which is perpendicular to the substrate 11. The predetermined angle θ1 is, for example, 45°. This step corresponds to the second step.

Figure 6:
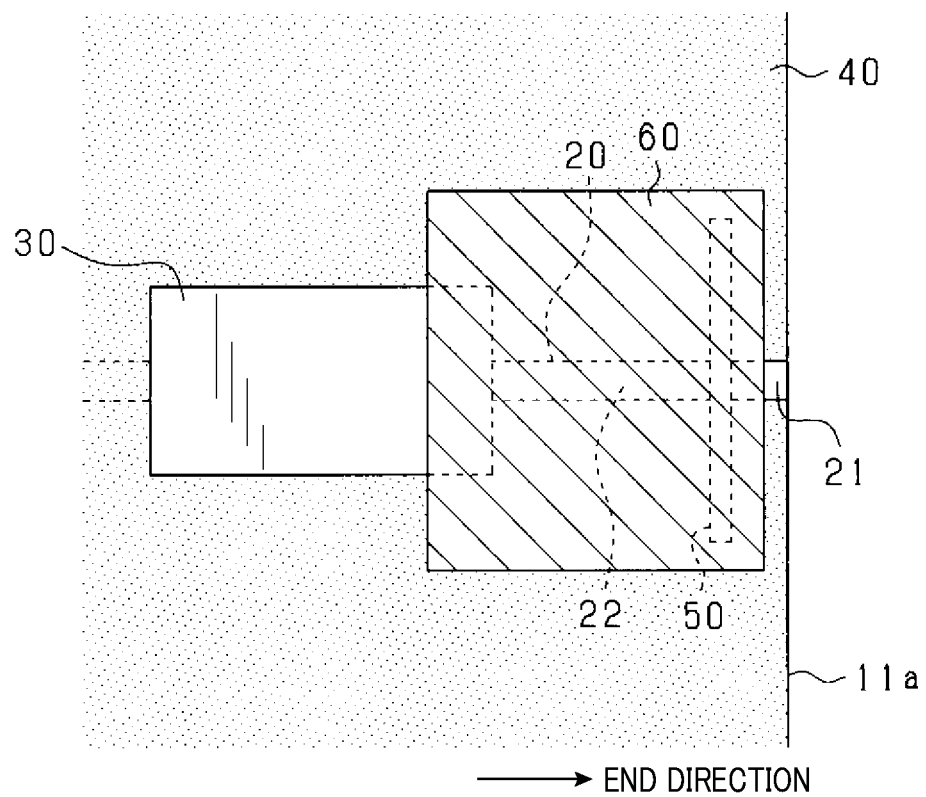
FIG. 6 is an enlarged front view showing the printed wiring pattern and the protective layer.
Figure 7:
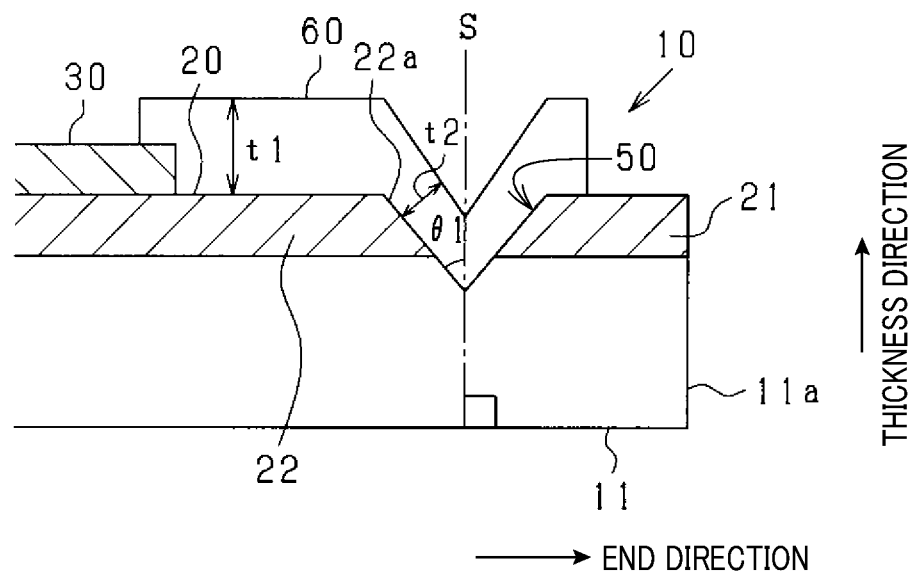
FIG. 7 is an enlarged cross-sectional view showing the printed wiring pattern and the protective layer.

Subsequently, as shown in FIGS. 6 and 7, a protective layer 60 is formed of a resist material so as to cover the cut surface 22a in the state in which the first pattern 20 is cut. That is, after the first pattern 20 is cut, the cut surface 22a is not polished, and the resist material is applied while the surface of the cut surface 22a remains rough. As a result, the resist material can be almost prevented from flowing over the cut surface 22a. This is due to the rough and obliquely-cut surface 22a, which can provide the liquid-state resist material with a retention force to prevent the material from dropping or flowing down easily.

Then, the resist material is cured to form the protective layer 60. Therefore, the thickness t2 of the resist layer on the cut surface 22a (i.e., the thickness of the protective layer 60) can be almost prevented from becoming smaller than the thickness t1 of the resist layer on the horizontal surface of the second portion 22 (i.e., the thickness of the protective layer 60) in the thickness direction. Further, in addition to the cut surface 22a, the protective layer 60 is formed so as to cover a space between the cut surface 22a and the second pattern 30 in the second portion 22. The step of forming the protective layer 60 corresponds to the third step. The first pattern 20, the second pattern 30, and the protective layer 60 constitute a printed wiring.

Figure 8:
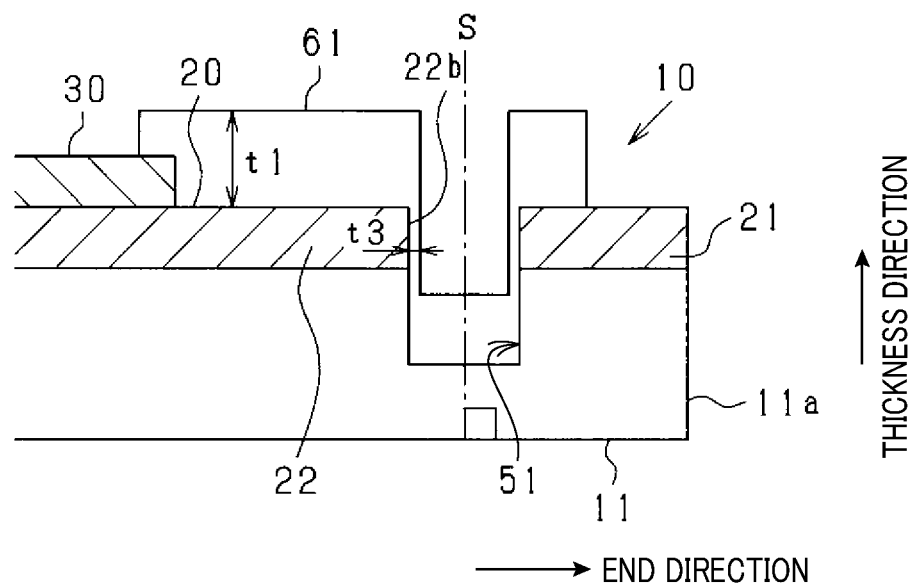
FIG. 8 is an enlarged cross-sectional view showing the printed wiring pattern and the protective layer of a comparative example.

FIG. 8 is an enlarged cross-sectional view showing the printed wiring pattern and the protective layer 61 of the comparative example. In the comparative example, a vertically cut groove 51 is formed in place of the V-shaped groove 50. That is, by forming the vertically cut groove 51 on the surface of the substrate 11, the first pattern 20 is cut. In this case, the cut surface 22b of the second portion 22 is parallel to the plane S perpendicular to the substrate 11. Therefore, when the resist material is applied, the resist flows over the cut surface 22b. As a result, the thickness t3 of the resist layer on the cut surface 22b becomes smaller than the thickness t1 of the resist layer on the horizontal surface of the second portion 22, and consequently, the thickness of the protective layer 61 covering the cut surface 22b becomes smaller.

The present embodiment described in detail above has the following advantages.

In the second step, the first pattern 20 is cut into a first portion 21 and a second portion 22. In detail, the first portion 21 is cut on the side of the end face 11a of the substrate 11 from the predetermined position P and the second portion 22 is cut on the inner side of the predetermined position P. For this reason, the first portion 21 can be cut off in the first pattern 20 so that a portion extending to the end face 11a of the substrate 11 does not remain in the second portion 22. Further, the cut surface 22a of the second portion 22 is inclined by a predetermined angle θ1 with respect to the imaginary plane S perpendicular to the substrate 11. Therefore, as compared with the case where the cut surface 22a in the second portion 22 is perpendicular to the substrate 11, the cut surface 22a in the second portion 22 can be easier to cover with the protective layer 60. Moreover, since this step involves only cutting the first pattern 20 for making the cut surface 22a in the second portion 22 to incline, it is easier than the etching step.

In the third step, the protective layer 60 of the second portion 22 is formed so as to cover the cut surface 22a of the second portion 22. Therefore, corrosion of the printed wiring can be almost prevented while simplifying the manufacturing step of the printed-wiring assembly.

In the fourth step between the first step and the second step, a voltage is applied to the first pattern 20, and the second pattern 30 of the electrolytic plating layer is formed on the first pattern 20 by the electrolytic plating method. Therefore, the first pattern 20 can be used as a power supply layer in the electrolytic plating method. Furthermore, since the first pattern 20 of the printed wiring extends to the end face 11a of the substrate 11, the first pattern 20 becomes easier to use as a portion to which a voltage is applied in an electrolytic plating method.

In the second step, the first pattern 20 is cut into the first portion 21 on the side of the end face 11a from the predetermined position P between the end face 11a of the substrate 11, and the second pattern 30, and the second portion 22 on the inner side from the predetermined position P. In the third step, the protective layer 60 of the second portion 22 is formed. Therefore, in the first pattern 20, the progress of corrosion can be almost prevented from the first portion 21 which becomes unnecessary after the formation of the second pattern 30 (electrolytic plating layer).

In the third step, the protective layer 60 is formed so as to cover the cut surface 22a and the space between the cut surface 22a and the second pattern 30 in the second portion 22. Therefore, exposure between the above-described cut surface 22a and the second pattern 30 in the second portion 22 can be almost prevented, and corrosion of the second portion 22 can be almost prevented.

When the cut surface 22a in the second portion 22 is polished after the first pattern 20 is cut in the second step, the resist material easily flows over the cut surface 22a when the protective layer 60 is formed of a resist material. In this case, the cut surface 22a may not be easily covered by the protective layer 60 of the resist. In this regard, in the third step, the protective layer 60 is formed of a resist material so as to cover the cut surface 22a in the state in which the first pattern 20 is cut in the second step. Therefore, the resist material can be almost prevented from flowing over the cut surface 22a, and the cut surface 22a can be easily covered by the protective layer 60 of the resist. Further, the step of polishing the cut surface 22a can be omitted, and thus the manufacturing step of the printed-wiring assembly can be simplified.

The first pattern 20 is cut by a router, which is a device for cutting the substrate 11, and the cut surface 22a is inclined by a predetermined angle θ1 with respect to the imaginary plane S perpendicular to the substrate 11. Therefore, the first pattern 20 can be cut using an existing apparatus, and thus a new apparatus is not necessary.

Note that the above-described embodiment can be modified and implemented as follows. The same portions as those in the above-described embodiment are denoted by the same reference numerals, and a description thereof is omitted.

Figure 9:
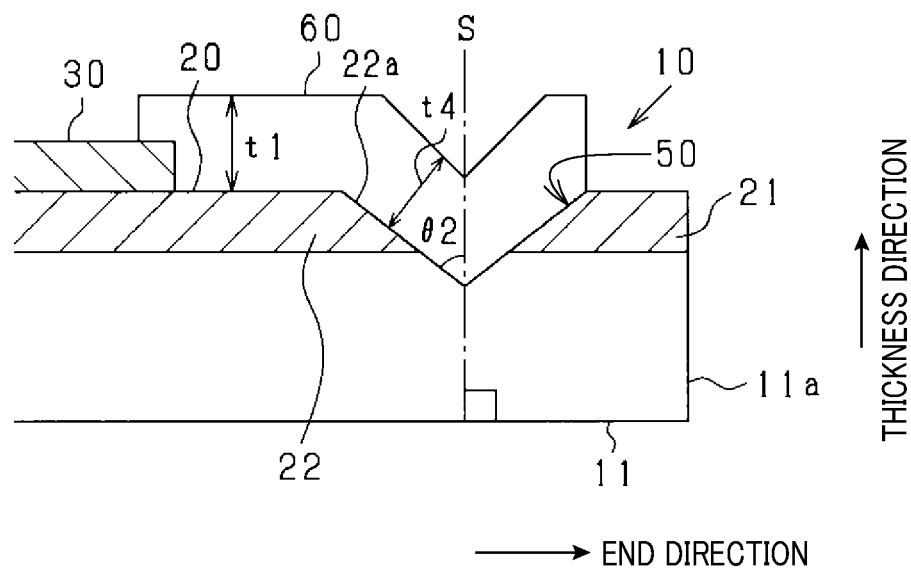
FIG. 9 is an enlarged cross-sectional view showing a modification of the printed wiring pattern and the protective layer.
Figure 10:
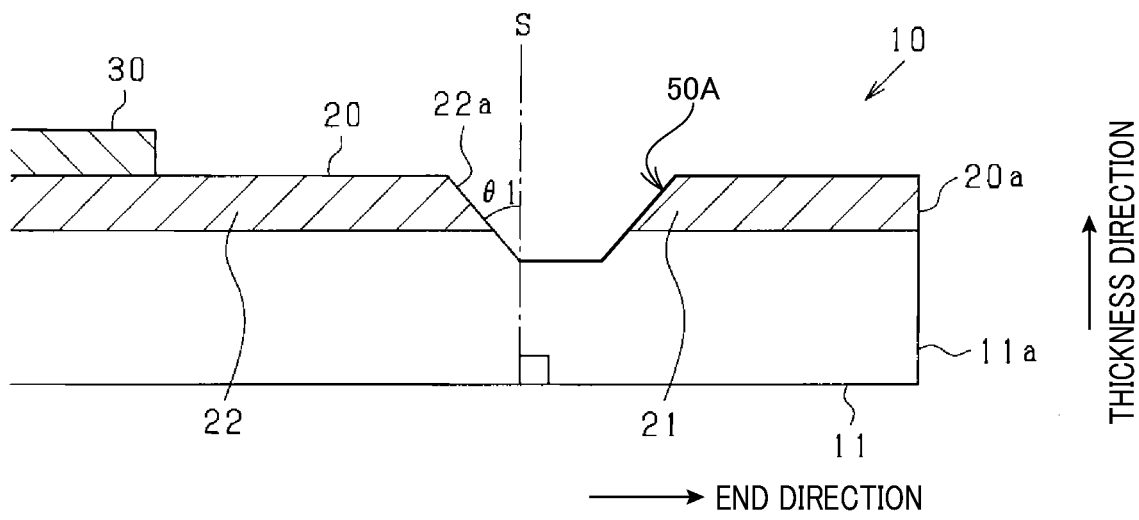
FIG. 10 is an enlarged cross-sectional view showing the printed wiring pattern according to another modification.

FIG. 9 is an enlarged cross-sectional view showing a modification of the printed wiring pattern and the protective layer 60. The cutting surface 22a (predetermined end face) of the second portion 22 may be inclined by a predetermined angle θ2 with respect to the imaginary plane S perpendicular to the substrate 11. The predetermined angle θ2 is, for example, 60°. As described above, the closer the predetermined angle θ is to 90°, the closer the thickness t4 of the resist layer on the cut surface 22a can be to the thickness t1 of the resist layer on the horizontal surface of the second portion 22. Therefore, the predetermined angle θ can be set in a range of 30° or more and less than 90° (30°≤θ<90°).

The first pattern 20 may be cut by a device other than a router, such as a substrate divider having a round blade, and the cut surface 22a may be inclined by a predetermined angle θ with respect to the imaginary plane S perpendicular to the substrate 11. Alternatively, the first pattern 20 may be cut using a tool manually by an operator, and the cut surface 22a may be inclined by a predetermined angle θ with respect to the imaginary plane S perpendicular to the substrate 11.

When the cut surface 22a in the second portion 22 is too rough, the cut surface 22a may be polished to such an extent that the resist material does not easily flow on the cut surface 22a.

The protective layer 60 is not limited to be formed of a resist material, and may be formed of another coating material such as a fluorine resin, or the like.

In FIG. 4, the longitudinal direction (extending direction) of the V-shaped groove 50 is parallel to the end face 11a of the substrate 11, but the longitudinal direction of the V-shaped groove 50 does not necessarily have to be parallel to the end face 11a. Even in this case, the cut surface 22a (predetermined end face) may be inclined by a predetermined angle θ with respect to the imaginary plane S perpendicular to the substrate 11.

A printed wiring without the second pattern 30 may be employed. Even in this case, corrosion of the second portion 22 of the first pattern 20 can be almost prevented while simplifying the manufacturing step.

Another modification of the foregoing V-shaped groove 50 can be shown as in FIG. 9. In this configuration, instead of the V-shaped groove 50, an inversed trapezoidal groove 50A with a flat bottom, when viewed in a lateral cross section, is formed in the same manner as the foregoing. This inversed trapezoidal groove 50A also has an oblique cut face 22a to the board 11, which is also able to have the foregoing various advantageous operations.

It can also be embodied as a substrate of a device other than a PLC.

The present disclosure is not limited to the foregoing embodiments and modifications, but may be variously changed within a range not departing from the spirit of the present disclosure.

PARTIAL REFERENCE SIGNS LIST

10 . . . Printed circuit board (composing a printed-wiring assembly)
11 . . . Substrate
11a . . . End face
20 . . . First pattern
21 . . . First part
22 . . . Second part
22a . . . Cut surface
30 . . . Second pattern
50 . . . V-shaped groove
60 . . . Protective layer

What is claimed is:

1. A printed-wiring assembly, including:
a first pattern formed to be a printed wiring pattern formed of copper or silver on a substrate, the printed wiring pattern including i) a first portion extending from a predetermined position to an end face of the substrate and ii) a second portion on inner side of the predetermined position, the predetermined end face on the predetermined position side of the second portion being inclined by a predetermined angle with respect to a surface perpendicular to the substrate, and
a protective layer of the second portion formed so as to cover the predetermined end face.

2. The printed-wiring assembly of claim 1, comprising a second pattern formed as a metal layer is connected to the second portion,
wherein the predetermined position is located between the end face of the substrate and the second pattern.

3. The printed-wiring assembly according to claim 2, wherein the protective layer is formed to cover the predetermined end face and a space between the predetermined end face and the second pattern in the second portion.

4. A method for manufacturing a printed-wiring assembly, including:
a first step of forming a first pattern of a printed wiring extending to an end face of a substrate by copper or silver on the substrate;
a second step of cutting the first pattern into a first portion on the end face side of a predetermined position and a second portion on inner side of the predetermined position, and a cut surface is inclined in the second portion by a predetermined angle with respect to a surface perpendicular to the substrate; and
a third step of forming a protective layer of the second portion so as to cover the cut surface.

5. The method for manufacturing a printed-wiring assembly according to claim 4, including a fourth step performed between the first step and the second step, the fourth step allowing a voltage to be applied to the first pattern such that a second pattern of an electrolytic plating layer is formed on the first pattern under performance of an electrolytic plating method based on the applied voltage; and
in the second step, the predetermined position is a position between the end face and the second pattern.

6. The method of manufacturing a printed-wiring assembly according to claim 5, wherein in the third step, the protective layer is formed so as to cover the cut surface and a space between the cut surface and the second pattern in the second portion.

7. The method of manufacturing a printed-wiring assembly according to claim 6, wherein, in the third step, the protective layer is formed of a resist material so as to cover the cut surface in a state in which the first pattern has been cut in the second step.

8. The method of manufacturing a printed-wiring assembly according to claim 7, wherein, in the second step, the first pattern is cut by a device for cutting a substrate, and the cut surface is inclined by the predetermined angle with respect to a surface perpendicular to the substrate.

9. The method of manufacturing a printed-wiring assembly according to claim 6, wherein, in the third step, the protective layer is formed of a resist material so as to cover the cut surface in a state in which the first pattern has been cut in the second step.

10. The method of manufacturing a printed-wiring assembly according to claim 9, wherein, in the second step, the first pattern is cut by a device for cutting a substrate, and the cut surface is inclined by the predetermined angle with respect to a surface perpendicular to the substrate.

11. The method of manufacturing a printed-wiring assembly according to claim 5, wherein, in the third step, the protective layer is formed of a resist material so as to cover the cut surface in a state in which the first pattern has been cut in the second step.

12. The method of manufacturing a printed-wiring assembly according to claim 11, wherein, in the second step, the first pattern is cut by a device for cutting a substrate, and the cut surface is inclined by the predetermined angle with respect to a surface perpendicular to the substrate.

13. The method of manufacturing a printed-wiring assembly according to claim 4, wherein, in the third step, the protective layer is formed of a resist material so as to cover the cut surface in a state in which the first pattern has been cut in the second step.

14. The method of manufacturing a printed-wiring assembly according to claim 13, wherein, in the second step, the first pattern is cut by a device for cutting a substrate, and the cut surface is inclined by the predetermined angle with respect to a surface perpendicular to the substrate.

* * * * *